US006958283B2

(12) United States Patent
Liao et al.

(10) Patent No.: US 6,958,283 B2
(45) Date of Patent: Oct. 25, 2005

(54) METHOD FOR FABRICATING TRENCH ISOLATION

(75) Inventors: Chien-Mao Liao, Taipei (TW); Tzu-En Ho, Ilan (TW); Chang-Rong Wu, Taipei (TW); Chih-How Chang, Taipei (TW); Sheng-Wei Yang, Taipei (TW); Sheng-Tsung Chen, Tainan (TW); Chung-Yuan Lee, Taoyuan (TW); Wen-Sheng Liao, Taipei (TW); Chen-Chou Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 63 days.

(21) Appl. No.: 10/690,859

(22) Filed: Oct. 22, 2003

(65) Prior Publication Data

US 2005/0020028 A1 Jan. 27, 2005

(30) Foreign Application Priority Data

Jul. 23, 2003 (TW) .............................. 92120043 A (51) Int. Cl.[7] ............................................. H01L 21/76
(52) U.S. Cl. ...................... 438/439; 438/435; 438/437
(58) Field of Search ......................................... 438/439

(56) References Cited

U.S. PATENT DOCUMENTS

| 6,225,225 | B1 * | 5/2001 | Goh et al. ................... 438/692 |
| 6,391,784 | B1 | 5/2002 | Ibok |
| 6,566,229 | B2 * | 5/2003 | Hong et al. .................. 438/435 |
| 6,593,207 | B2 * | 7/2003 | Hong et al. .................. 438/424 |
| 6,713,365 | B2 * | 3/2004 | Lin et al. ..................... 438/424 |
| 2005/0016948 | A1 * | 1/2005 | Yang et al. .................... 216/13 |

FOREIGN PATENT DOCUMENTS

TW 540135 7/2003

* cited by examiner

Primary Examiner—Thao P. Le
(74) Attorney, Agent, or Firm—Quintero Law Office (57) ABSTRACT

A method for forming a trench isolation. A semiconductor substrate with an opening is provided, on which a mask layer is formed. A first insulating layer is conformably formed on the semiconductor substrate and the trench, and the trench is filled with the first insulating layer. The first insulating layer is anisotropically etched to below the semiconductor substrate. A second insulating layer is formed on the semiconductor substrate and the trench. The second insulating layer is planarized to expose the mask layer.

44 Claims, 10 Drawing Sheets

METHOD FOR FABRICATING TRENCH ISOLATION

BACKGROUND OF THE INVENTION

1. Field of the Invention

The invention relates to a method for forming an isolation, and more particularly to reduce a cap size in a trench isolation of an aspect ratio greater than a predetermined value.

2. Description of the Related Art

Figure 1A:
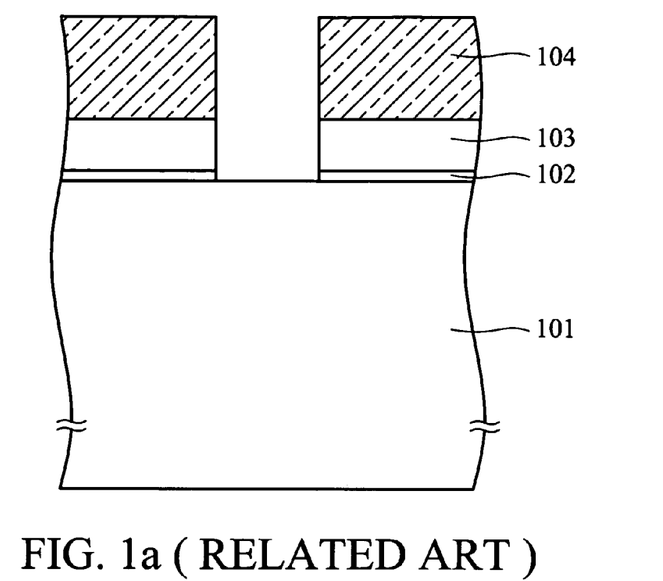
FIGS. 1a to 1d are cross sections of the conventional method for forming a trench isolation.
Figure 1B:
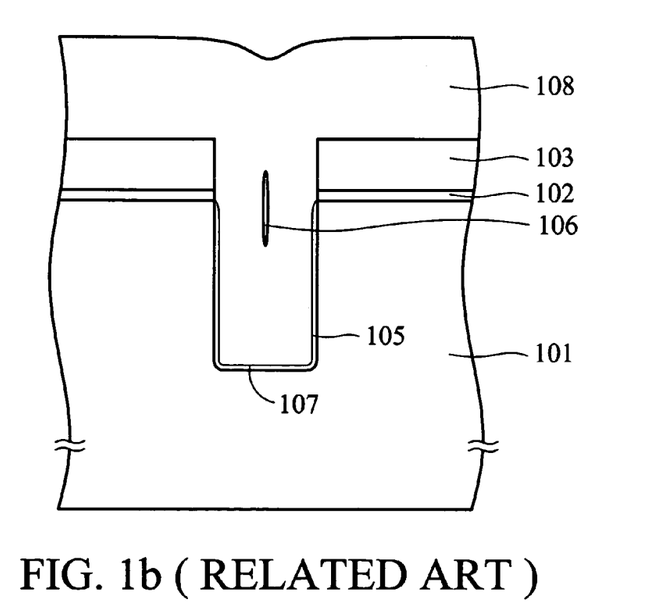
Figure 1C:
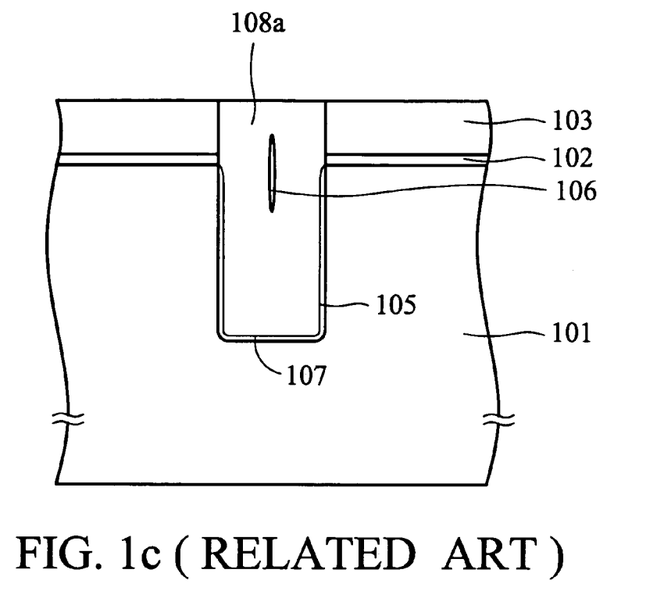

FIGS. 1a to 1c are cross sections of the conventional method for forming a trench isolation.

In FIG. 1a, a silicon substrate 101 is thermally oxidized to form a pad oxide layer 102, and a silicon nitride layer 103 is doped on the pad oxide layer 102 by chemical vapor deposition. A photoresist layer 104 is coated on the silicon nitride layer 103, and a pattern is defined by photolithography to expose an area for forming isolation. The silicon nitride layer 103 and the pad oxide layer 102 are sequentially etched using the photoresist layer 104 as a mask.

In FIG. 1b, the semiconductor substrate 101 is etched to form a trench 105 for defining an active region using the silicon nitride layer 103 and the pad oxide layer 102 as masks after the photoresist layer 104 has been removed. The trench 105 is thermally oxidized to form a thin silicon oxide layer to act as a lining oxide layer 107 on a bottom and a sidewall of the trench 105.

An oxide layer 108 is formed on the silicon nitride layer 103, and the trench 105 is filled with the oxide layer 108. The oxide layer 108 in the trench 105 has a cap 106 because the oxide layer 108 is difficult to fill into a small trench 105 particularly when the aspect ratio of the trench 105 is greater than 6.

In FIG. 1c, chemical mechanical polishing is performed on the oxide layer 108 to remove the excess silicon nitride layer 103 forming the isolation 108a.

Figure 1D:
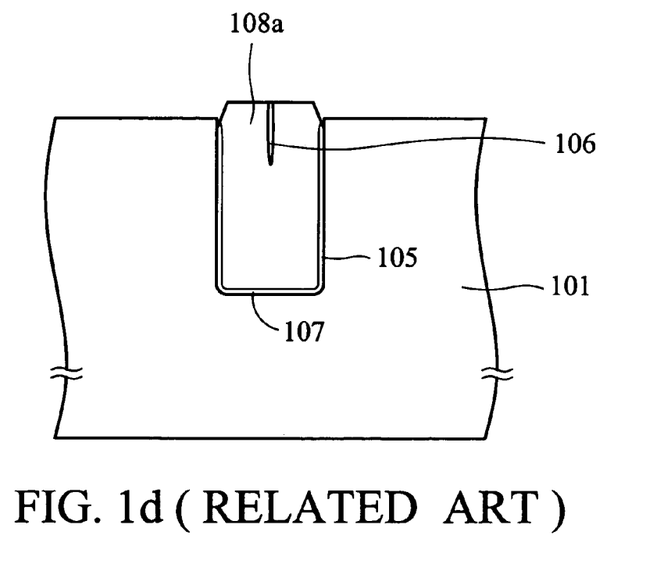

In FIG. 1d, the silicon nitride layer 103 and the pad oxide layer 102 are sequentially removed to leave the isolation 108a.

The material employed to form the isolation 108a is similar to the pad oxide layer 102, and the isolation 108a is etched when the pad oxide layer 102 is removed by wet etching. The cap 106 is exposed, and the etching solution fills the cap 106. The size of the cap 106 increases because the isolation 108a is etched, thus the reliability of the element is reduced.

SUMMARY OF THE INVENTION

The present invention is directed to a method of forming a trench isolation to prevent an increase in the size of the cap in the trench.

Accordingly, the present invention provides a method for forming a trench isolation. A semiconductor substrate with a trench is provided, wherein a mask layer is formed on the semiconductor substrate. A first insulating layer is conformably formed on the semiconductor substrate and the trench, and the trench is filled with the first insulating layer. The first insulating layer is anisotropically etched to below the level of the semiconductor substrate. A second insulating layer is formed on the semiconductor substrate and the trench. The second insulating layer is planarized to expose the mask layer.

Accordingly, the present invention also provides a method for forming a trench isolation. A semiconductor substrate is provided, in which a pad layer, a mask layer, and a patterned photoresist layer with an opening are sequentially formed thereon. The mask layer, the pad layer, and the semiconductor substrate are sequentially etched using the patterned photoresist layer as a mask to form a trench. The patterned photoresist layer is then removed. An LPCVD oxide layer is conformably formed on the semiconductor substrate and the trench, and the trench is filled with the LPCVD oxide layer. The LPCVD oxide layer is anisotropically etched to below the semiconductor substrate by at least 300 Å. An insulating layer is formed on the semiconductor substrate and the trench, wherein the trench is filled with the insulating layer. The insulating layer is planarized to expose the mask layer. The mask layer is then removed.

Accordingly, the present invention also provides a method for forming a trench isolation. A semiconductor substrate with a trench is provided, which a mask layer is formed thereon. A first insulating layer is formed on the semiconductor substrate and the trench. The first insulating layer is anisotropically etched to form a spacer on a sidewall of the trench. A second insulating layer is formed on the semiconductor substrate and the trench. The second insulating layer is planarized to expose the mask layer.

Accordingly, the present invention also provides a method for forming a trench isolation. A semiconductor substrate is provided, in which a pad layer, a mask layer, and a patterned photoresist layer with an opening are sequentially formed thereon. The mask layer, the pad layer, and the semiconductor substrate are sequentially etched using the patterned photoresist layer as a mask to form a trench. The patterned photoresist layer is then removed. An LPCVD oxide layer is conformably formed on the semiconductor substrate and the trench. The LPCVD oxide layer is anisotropically etched to form a spacer on a sidewall of the trench. An insulating layer is formed on the semiconductor substrate and the trench. The insulating layer is planarized to expose the mask layer. The mask layer is then removed.

Accordingly, the present invention also provides a method for forming a trench isolation. A semiconductor substrate is provided, in which a pad layer, a mask layer, and a patterned photoresist layer with a first opening and a second opening are sequentially formed thereon. The mask layer, the pad layer, and the semiconductor substrate to form a first trench and a second trench are sequentially etched using the patterned photoresist layer as a mask, wherein the aspect ratio of the first trench is greater than 6. The patterned photoresist layer is then removed. AN LPCVD oxide layer is conformably formed on the semiconductor substrate, the first trench, and the second trench, and the first trench is filled with the LPCVD oxide layer. The LPCVD oxide layer is anisotropically etched to below the semiconductor substrate by at least 300 Å. An insulating layer is formed on the semiconductor substrate, the first trench and the second trench, wherein the first trench and the second trench are filled with the insulating layer. The insulating layer is planarized to expose the mask layer. The mask layer is then removed.

Accordingly, the present invention also provides a method for forming a trench isolation. A semiconductor substrate is provided, in which a pad layer, a mask layer, and a patterned photoresist layer with a first opening and a second opening are sequentially formed thereon. The mask layer, the pad layer, and the semiconductor substrate to form a first trench and a second trench are sequentially etched using the patterned photoresist layer as a mask, wherein the aspect ratio of the first trench is greater than 6. The patterned photoresist layer is then removed. AN LPCVD oxide layer is conformably formed on the semiconductor substrate. The LPCVD oxide layer is anisotropically etched to form a spacer on a sidewall of the first trench. An insulating layer is formed on the semiconductor substrate, the first trench and the second trench. The insulating layer is planarizd to expose the mask layer. The mask layer is then removed.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

Embodiment 1

FIGS. 2a to 2g are cross sections of the method for forming a trench isolation of Embodiment 1 of the present invention.

Figure 2A:
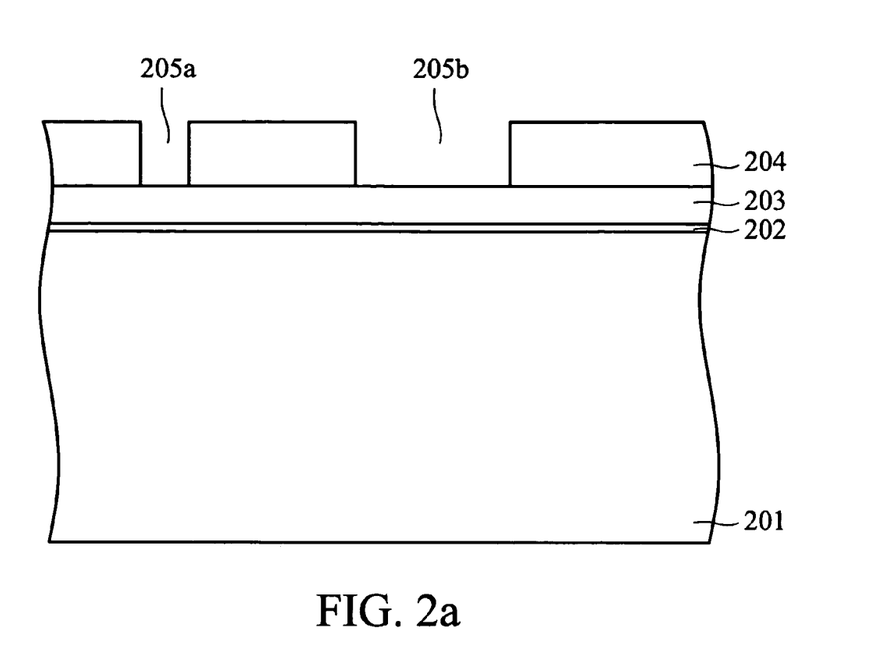
FIGS. 2a to 2g are cross sections of the method for forming a trench isolation of the first embodiment of the present invention.

In FIG. 2a, a semiconductor substrate 201, such as silicon substrate, is provided. A pad layer 202, such as pad oxide layer formed by thermal oxidation, a mask layer 203, such as CVD silicon nitride, and a patterned photoresist layer 204 with opening 205a and 205b are sequentially formed on the semiconductor substrate 201, the opening 205a is smaller than the opening 205b, and the surface of the mask layer 203 is exposed by the opening 205a and 205b.

Figure 2B:
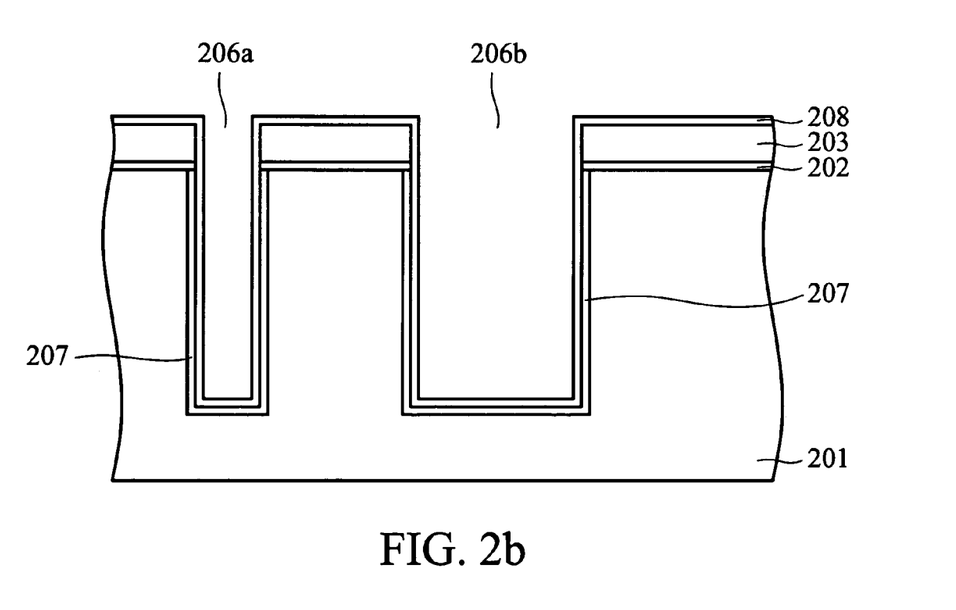

In FIG. 2b, the mask layer 203, the pad layer 202, and the semiconductor substrate 201 are anisotropically etched to form trenches 206a and 206b sequentially using the patterned photoresist layer 204 as a mask. The anisotropical etching uses plasma etching or reactive ion etching.

A lining layer 207, such as an oxide layer, is formed on the trench 206a and 206b, and then a lining layer 208, such as a nitride layer, is formed on the semiconductor substrate 201. The thickness of the oxide layer is about 50 Å, and the nitride layer is about 100 Å.

Figure 2C:
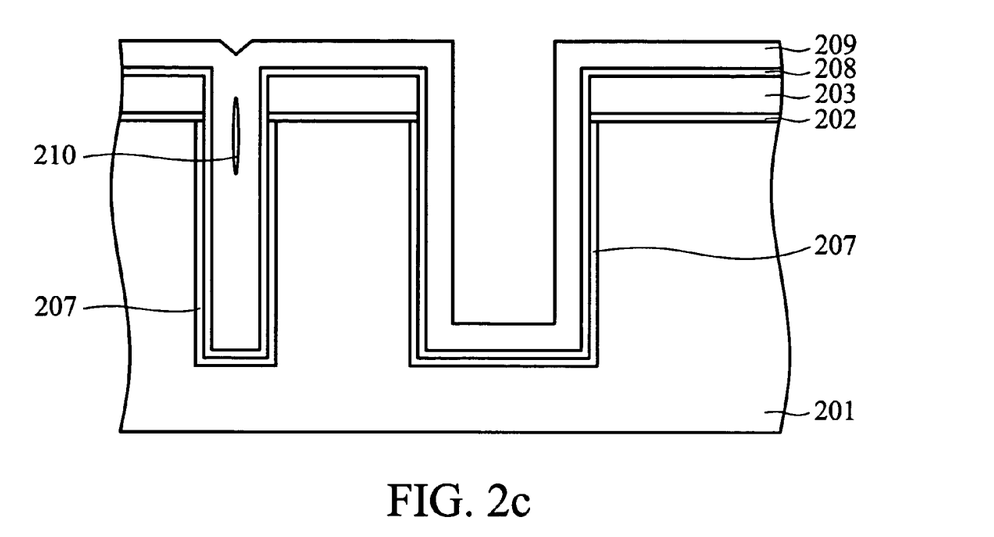

In FIG. 2c, an insulating layer 209 is conformably formed on the trench 206a and 206b and the semiconductor substrate 201. The insulating layer 209 is conformably formed on the surface of the trench 206b, and the trench 206a is filled with the insulating layer 209 because the size of the trench 206b is greater than the trench 206a.

The insulating layer 209 is filled into the trench 206a by LPCVD. The aspect ration of the trench 206a is greater than 6. In fact, the surface of the trench 206a is filled with the insulating layer 209, but a cap 210 is formed in the insulating layer 209 in the trench 206a.

Figure 2D:
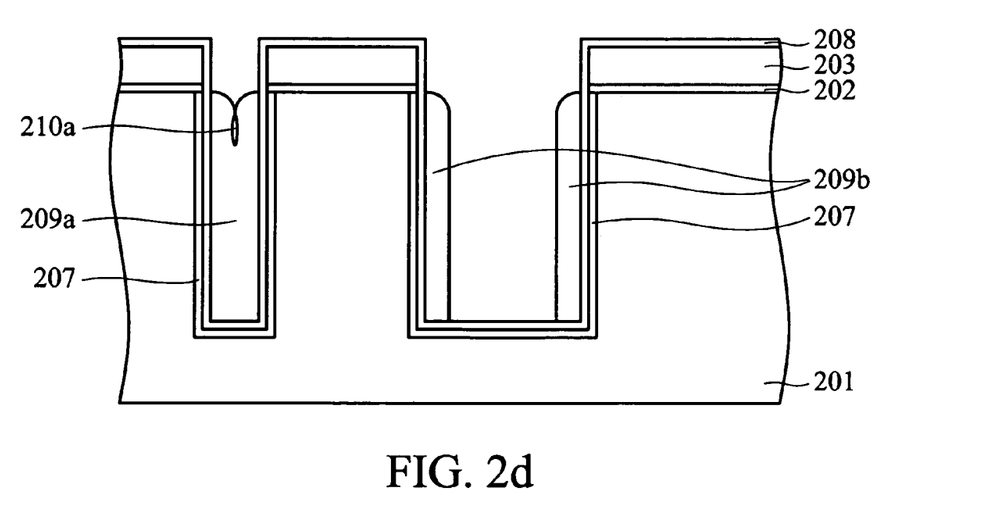

In FIG. 2d, the insulating layer 209 is anisotropically etched to below than the semiconductor substrate 201, the cap 210a is exposed, and a spacer 209a is formed on a sidewall of the trench 206b at the same time. The insulating layer 209a is lower than the semiconductor substrate 201 by about 300 Å. The anisotropic etching uses plasma etching or reactive ion etching.

Figure 2E:
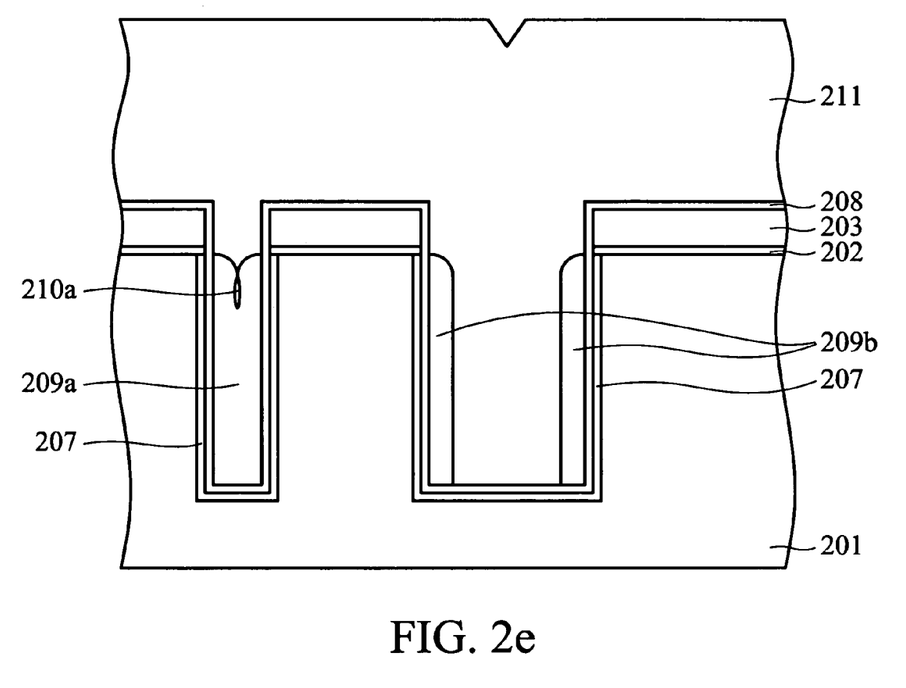

In FIG. 2e, an insulating layer 211, such as an oxide layer, is formed on the semiconductor substrate 201, and the trench 206a and 206b are filled with the insulating layer 211. The oxide layer is a TEOS oxide layer.

Figure 2F:
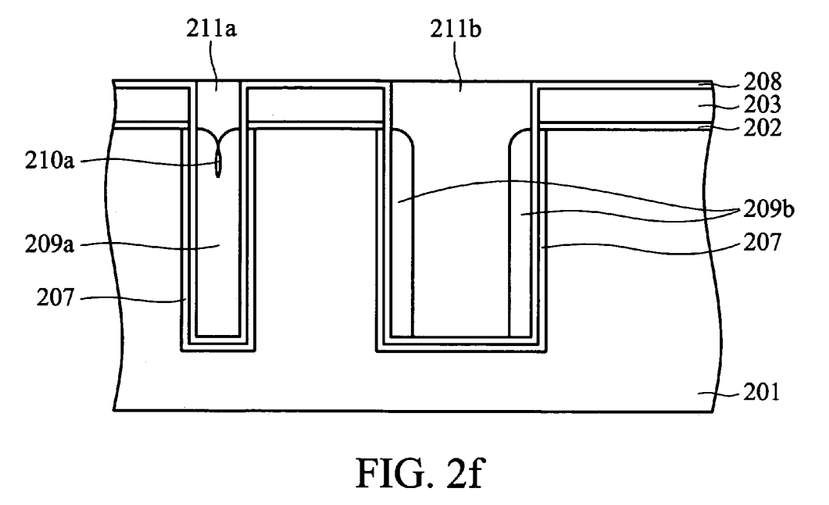

In FIG. 2f, the insulating layer 211 is planarized by CMP to expose the lining layer 208 or the mask layer 203.

Figure 2G:
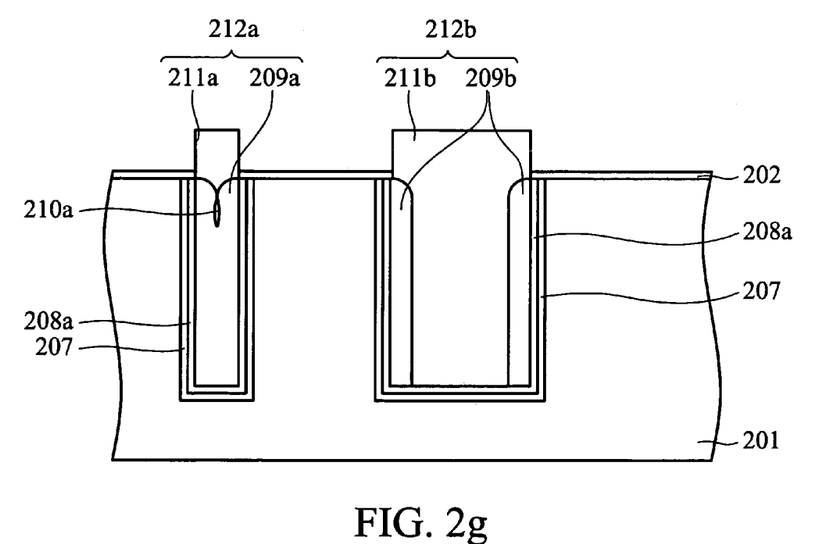

In FIG. 2g, the exposing lining layer 208 and the mask layer 203 are sequentially removed, and trench isolations 212a and 212b protect to the semiconductor substrate 201 are formed.

The size of the cap 210a is reduced, and the position of the cap 210a is farther from the surface of the trench isolation 212a than that of the cap in the conventional method of Embodiment 1 of the present invention.

Embodiment 2

FIGS. 3a to 3g are cross sections of the method for forming a trench isolation of Embodiment 2 of the present invention.

Figure 3A:
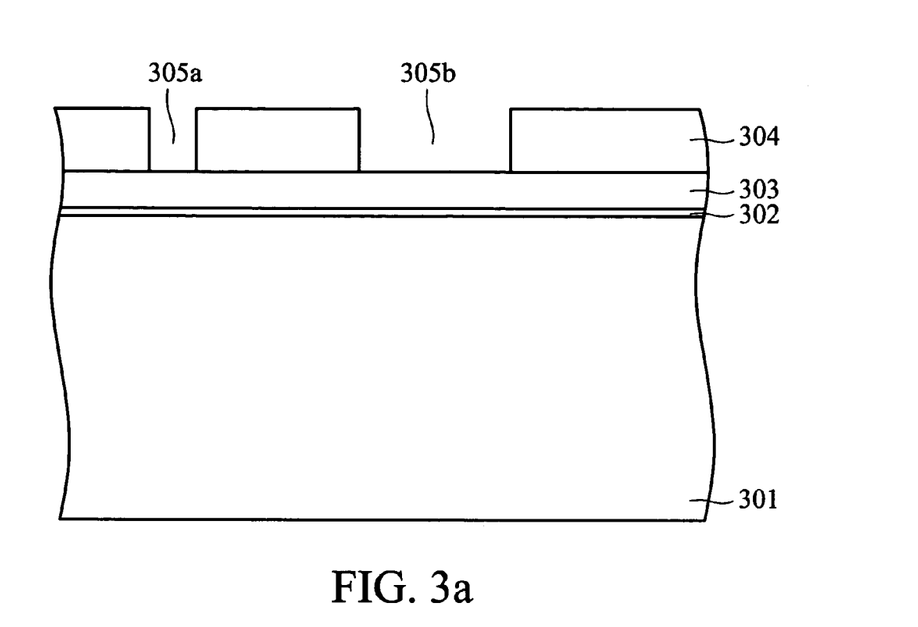
FIGS. 3a to 3g are cross sections of the method for forming a trench isolation of the second embodiment of the present invention.

In FIG. 3a, a semiconductor substrate 301, such as a silicon substrate, is provided. A pad layer 302, such as a pad oxide layer formed by thermal oxidation, a mask layer 303, such as CVD silicon nitride, and a patterned photoresist layer 304 with openings 305a and 305b are sequentially formed on the semiconductor substrate 301, the opening 305a is smaller than the opening 305b, and the surface of the mask layer 303 is exposed by the openings 305a and 305b.

Figure 3B:
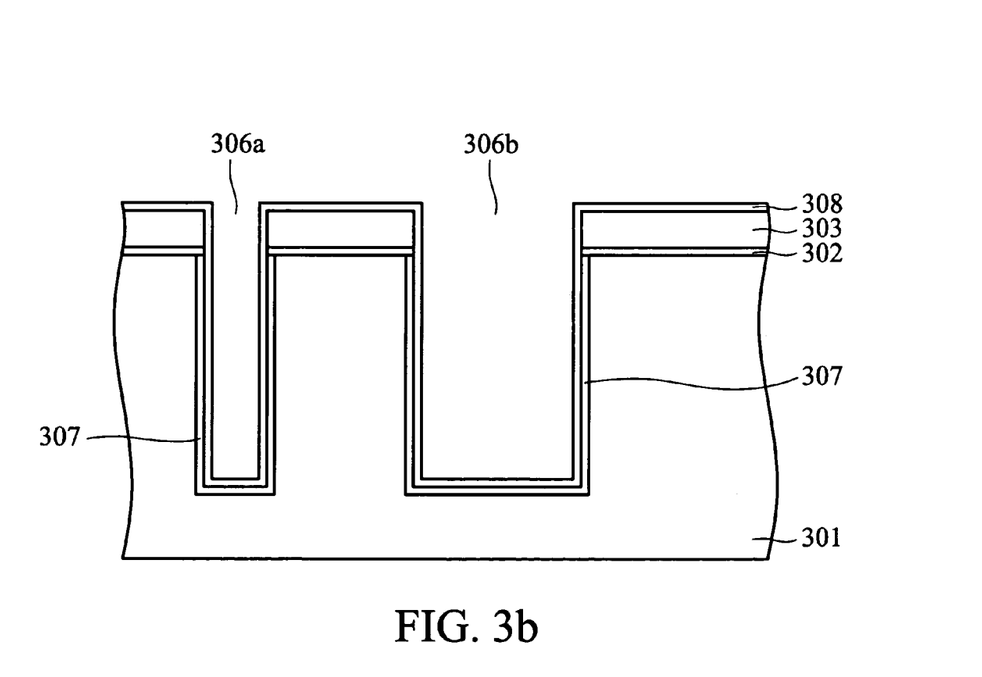

In FIG. 3b, the mask layer 303, the pad layer 302, and the semiconductor substrate 301 are anisotropically etched to form trenches 306a and 306b sequentially using the patterned photoresist layer 304 as a mask. The anisotropical etching uses plasma etching or reactive ion etching.

A lining layer 307, such as an oxide layer, is formed on the trench 306a and 306b, and then a lining layer 308, such as a nitride layer, is formed on the semiconductor substrate 301. The thickness of the oxide layer is about 50 Å, and the nitride layer is about 100 Å.

Figure 3C:
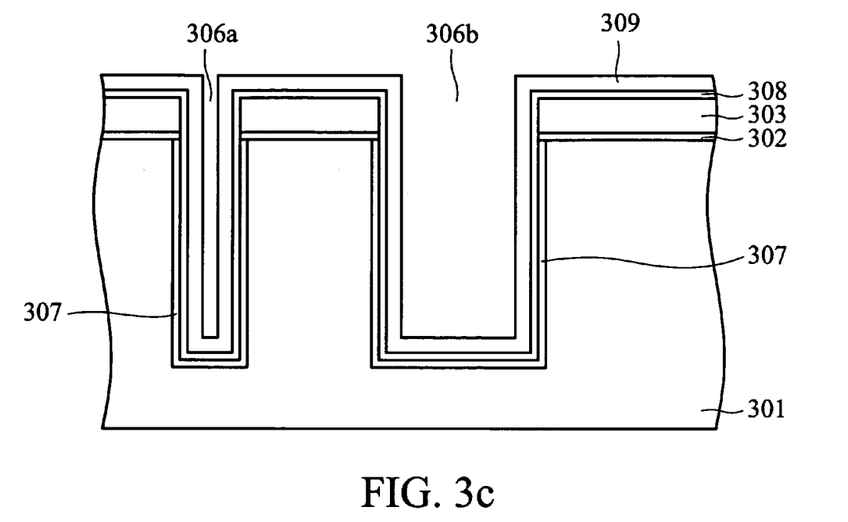

In FIG. 3c, an insulating layer 309 is conformably formed on the trench 306a and 306b and the semiconductor substrate 301. The insulating layer 309 is conformably formed on the surface of the trench 306b, and the trench 306a is filled with the insulating layer 309.

Figure 3D:
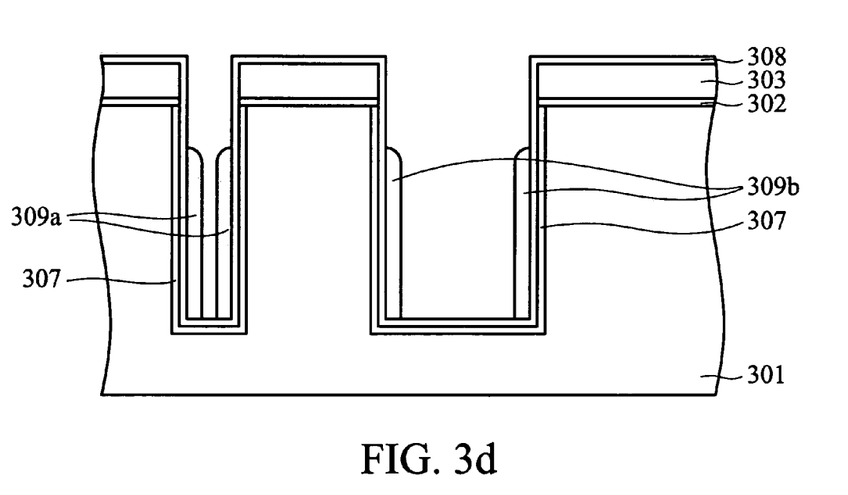

In FIG. 3d, the insulating layer 309 is anisotropically etched to form a spacer 309a and 309b on a sidewall of the trench 306a and 306b respectively. The anisotropical etching uses plasma etching or reactive ion etching.

Figure 3E:
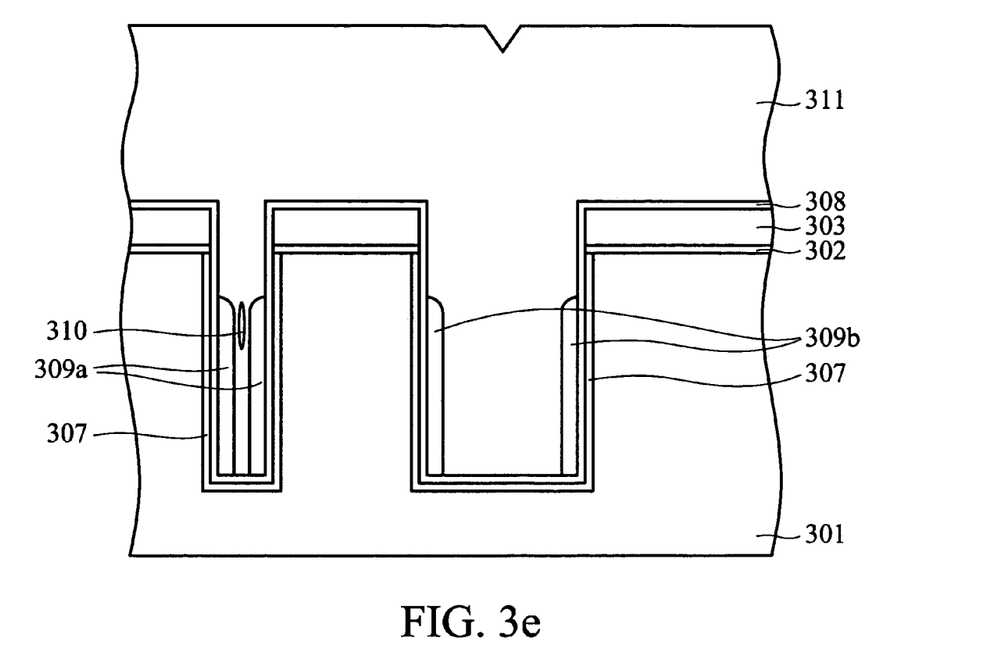

In FIG. 3e, an insulating layer 311, such as an oxide layer, is formed on the semiconductor substrate 301, and the trench 306a and 306b are filled with the insulating layer 311. The oxide layer is a TEOS oxide layer.

The insulating material is difficult to fill into the trench 306a because of the small trench 306a, particularly when the aspect ration of the trench 306a is greater than 6, and the cap 310 is in the insulating layer 311 in the trench 306a.

Figure 3F:
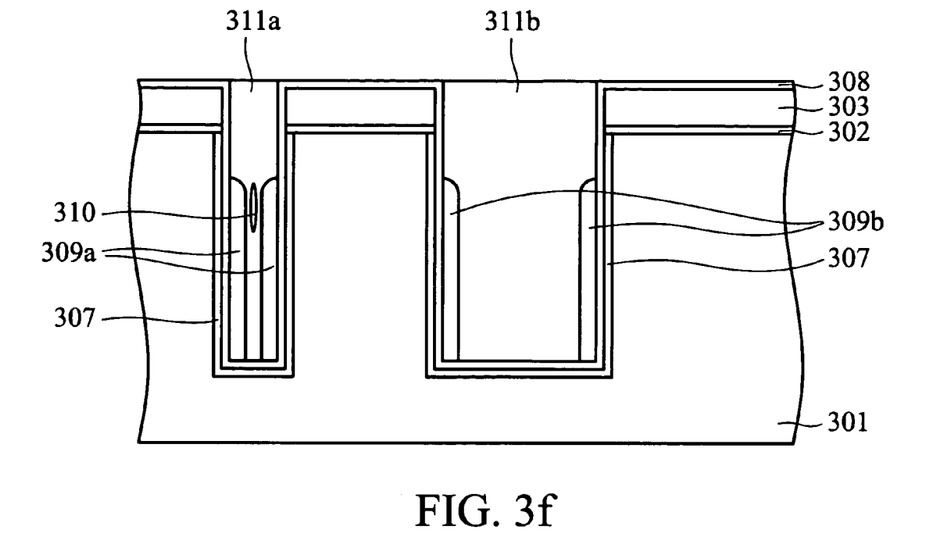

In FIG. 3f, the insulating layer 311 is planarized by CMP to expose the lining layer 308 or the mask layer 303.

Figure 3G:
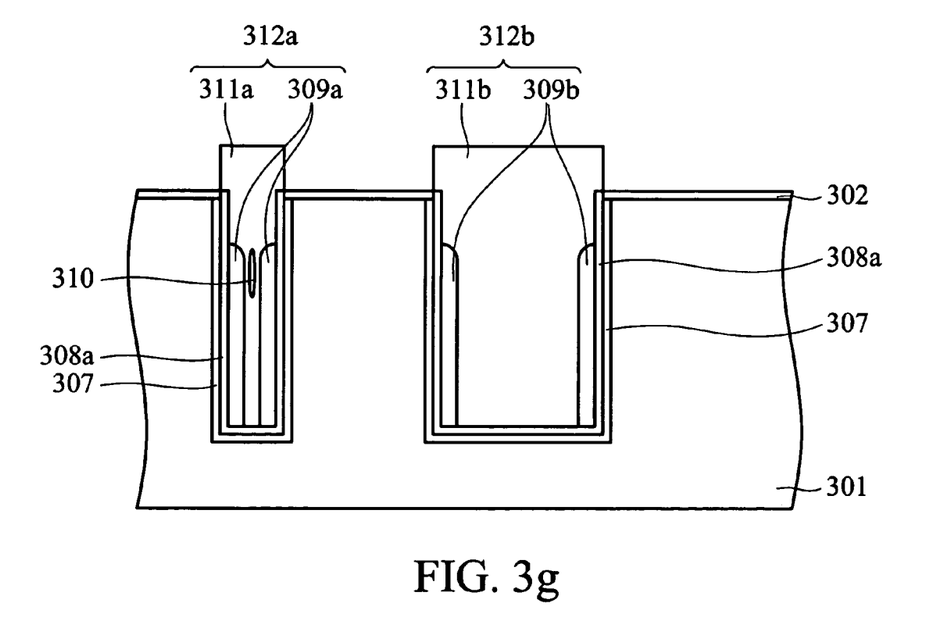

In FIG. 3g, the exposed lining layer 308 and the mask layer 303 are sequentially removed, and trench isolations 312a and 312b to protect the semiconductor substrate 301 are formed.

The position of the cap 310a is farther from the surface of the trench isolation 312a than that of the cap in the conventional method of Embodiment 2 of the present invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a trench isolation, comprising:
   providing a semiconductor substrate with a trench, wherein the semiconductor substrate has a mask layer;
   forming a LPCVD oxide layer to cover the semiconductor substrate and the trench, wherein the trench is filled with the LPCVD oxide layer;
   anisotropically etching the LPCVD oxide layer to below the level of the semiconductor substrate;
   forming an insulating layer to cover the semiconductor substrate and the LPCVD oxide layer in the trench; and
   planarizing the insulating layer to expose the mask layer.

2. The method for forming a trench isolation as claimed in claim 1, wherein the mask layer is a nitride layer.

3. The method for forming a trench isolation as claimed in claim 1, wherein the anistropic etching is plasma etching or reactive ion etching.

4. The method for forming a trench isolation as claimed in claim 1, wherein the LPCVD oxide layer is lower than the semiconductor substrate by at least 300 Å after anistropic etching.

5. The method for forming a trench isolation as claimed in claim 1, wherein the insulating layer is an oxide layer.

6. The method for forming a trench isolation as claimed in claim 5, wherein the oxide layer is a TEOS oxide layer.

7. The method for forming a trench isolation as claimed in claim 1, wherein the planarizing is chemical mechanical polishing.

8. A method for forming a trench isolation, comprising:
   providing a semiconductor substrate, wherein a pad layer, a mask layer, and a patterned photoresist layer with an opening are sequentially formed thereon;
   sequentially etching the mask layer, the pad layer, and the semiconductor substrate to form a trench using the patterned photoresist layer as a mask;
   removing the patterned photoresist layer;
   conformably forming an LPCVD oxide layer to cover the semiconductor substrate and the trench, wherein the trench is filled with the LPCVD oxide layer;
   anisotropically etching the LPCVD oxide layer to lower its surface below a top surface of the semiconductor substrate by at least 300 Å;
   forming an insulating layer to cover the semiconductor substrate and the LPCVD oxide layer in the trench, wherein the trench is filled with the insulating layer;
   planarizing the insulating layer to expose the mask layer; and
   removing the mask layer.

9. The method for forming a trench isolation as claimed in claim 8, wherein the pad layer is an oxide layer.

10. The method for forming a trench isolation as claimed in claim 8, wherein the mask layer is a nitride layer.

11. The method for forming a trench isolation as claimed in claim 8, wherein the aspect ratio of the trench is greater than 6.

12. The method for forming a trench isolation as claimed in claim 8, wherein the anisotropic etching is plasma etching or reactive ion etching.

13. The method for forming a trench isolation as claimed in claim 8, wherein the insulating layer is an oxide layer.

14. The method for forming a trench isolation as claimed in claim 13, wherein the oxide layer is a TEOS oxide layer.

15. The method for forming a trench isolation as claimed in claim 8, wherein the planarizing is chemical mechanical polishing.

16. A method for forming a trench isolation, comprising:
   providing a semiconductor substrate with a trench, wherein the semiconductor substrate has a mask layer;
   forming a LPCVD oxide layer to cover the semiconductor substrate and the trench;
   anisotropically etching the LPCVD oxide layer to form a spacer on a sidewall of the trench;
   forming an insulating layer to cover the semiconductor substrate and the LPCVD oxide layer in the trench; and
   planarizing the insulating layer to expose the mask layer.

17. The method for forming a trench isolation as claimed in claim 16, wherein the mask layer is a nitride layer.

18. The method for forming a trench isolation as claimed in claim 16, wherein the anistropic etching is plasma etching or reactive ion etching.

19. The method for forming a trench isolation as claimed in claim 16, wherein the spacer is lower than the semiconductor substrate.

20. The method for forming a trench isolation as claimed in claim 16, wherein the insulating layer is an oxide layer.

21. The method for forming a trench isolation as claimed in claim 20, wherein the oxide layer is a TEOS oxide layer.

22. The method for forming a trench isolation as claimed in claim 16, wherein the planarizing is chemical mechanical polishing.

23. A method for forming a trench isolation, comprising:
   providing a semiconductor substrate, wherein a pad layer, a mask layer, and a patterned photoresist layer with an opening are sequentially formed thereon;
   sequentially etching the mask layer, the pad layer, and the semiconductor substrate to form a trench using the patterned photoresist layer as a mask;
   removing the patterned photoresist layer;
   conformably forming an LPCVD oxide layer to cover the semiconductor substrate and the trench;
   anisotropically etching the LPCVD oxide layer to form a spacer on a sidewall of the trench;
   forming an insulating layer to cover the semiconductor substrate and LPCVD oxide layer in the trench;
   planarizing the insulating layer to expose the mask layer; and
   removing the mask layer.

24. The method for forming a trench isolation as claimed in claim 23, wherein the pad layer is an oxide layer.

25. The method for forming a trench isolation as claimed in claim 23, wherein the mask layer is a nitride layer.

26. The method for forming a trench isolation as claimed in claim 23, wherein the aspect ratio of the trench is greater than 6.

27. The method for forming a trench isolation as claimed in claim 23, wherein the anisotropic etching is plasma etching or reactive ion etching.

28. The method for forming a trench isolation as claimed in claim 23, wherein the spacer is lower than the semiconductor substrate.

29. The method for forming a trench isolation as claimed in claim 23, wherein the insulating layer is an oxide layer.

30. The method for forming a trench isolation as claimed in claim 29, wherein the insulating layer is a TEOS oxide layer.

31. The method for forming a trench isolation as claimed in claim 23, wherein the planarizing is performed by chemical mechanical polishing.

32. A method for forming a trench isolation, comprising:
providing a semiconductor substrate, wherein a pad layer, a mask layer, and a patterned photoresist layer with a first opening and a second opening are sequentially formed thereon;
sequentially etching the mask layer, the pad layer, and the semiconductor substrate to form a first trench and a second trench using the patterned photoresist layer as a mask, wherein the aspect ratio of the first trench is greater than 6;
removing the patterned photoresist layer;
conformably forming an LPCVD oxide layer to cover the semiconductor substrate, the first trench, and the second trench, wherein the first trench is filled with the LPCVD oxide layer;
anisotropical etching the LPCVD oxide layer to lower its surface below a top surface of the semiconductor substrate by at least 300 Å;
forming an insulating layer to cover the semiconductor substrate, the LPCVD oxide layer in the first trench and the LPCVD oxide layer in the second trench,
planarizing the insulating layer to expose the mask layer; and
removing the mask layer.

33. The method for forming a trench isolation as claimed in claim 32, wherein the pad layer is an oxide layer.

34. The method for forming a trench isolation as claimed in claim 32, wherein the mask layer is a nitride layer.

35. The method for forming a trench isolation as claimed in claim 32, wherein the anisotropic etching is plasma etching or reactive ion etching.

36. The method for forming a trench isolation as claimed in claim 32, wherein the insulating layer is a TEOS oxide layer.

37. The method for forming a trench isolation as claimed in claim 32, wherein the planarizing is performed by chemical mechanical polishing.

38. A method for forming a trench isolation, comprising:
providing a semiconductor substrate, wherein a pad layer, a mask layer, and a patterned photoresist layer with a first opening and a second opening are sequentially formed thereon;
sequentially etching the mask layer, the pad layer, and the semiconductor substrate to form a first trench and a second trench using the patterned photoresist layer as a mask, wherein the aspect ratio of the first trench is greater than 6;
removing the patterned photoresist layer;
conformably forming an LPCVD oxide layer to cover the semiconductor substrate;
anisotropically etching the LPCVD oxide layer to form a spacer on a sidewall of the first trench;
forming an insulating layer to cover the semiconductor substrate, the LPCVD oxide layer in the first trench and the LPCVD oxide layer in the second trench;
planarizing the insulating layer to expose the mask layer; and
removing the mask layer.

39. The method for forming a trench isolation as claimed in claim 38, wherein the pad layer is an oxide layer.

40. The method for forming a trench isolation as claimed in claim 38, wherein the mask layer is a nitride layer.

41. The method for forming a trench isolation as claimed in claim 38, wherein the anisotropic etching is plasma etching or reactive ion etching.

42. The method for forming a trench isolation as claimed in claim 38, wherein the spacer is lower than the semiconductor substrate.

43. The method for forming a trench isolation as claimed in claim 38, wherein the insulating layer is a TEOS oxide layer.

44. The method for forming a trench isolation as claimed in claim 32, wherein the planarizing is chemical mechanical polishing.

* * * * *